(12) United States Patent
Nilsson

(10) Patent No.: US 9,344,311 B2
(45) Date of Patent: May 17, 2016

(54) WIRELESS TRANSMISSION

(71) Applicant: Ericsson Modems SA, Plan-les-Ouates (CH)

(72) Inventor: Magnus Nilsson, Lund (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 121 days.

(21) Appl. No.: 14/357,633

(22) PCT Filed: Nov. 14, 2012

(86) PCT No.: PCT/EP2012/072558
§ 371 (c)(1),
(2) Date: May 14, 2014

(87) PCT Pub. No.: WO2013/072337
PCT Pub. Date: May 23, 2013

(65) Prior Publication Data
US 2014/0314175 A1    Oct. 23, 2014

Related U.S. Application Data

(60) Provisional application No. 61/595,234, filed on Feb. 6, 2012.

(30) Foreign Application Priority Data

Nov. 14, 2011    (EP) .................................... 11188973

(51) Int. Cl.
*H03J 7/32*        (2006.01)
*H04L 27/20*       (2006.01)
*H04B 1/04*        (2006.01)

(52) U.S. Cl.
CPC ............. *H04L 27/20* (2013.01); *H04B 1/0475* (2013.01); *H04B 2001/045* (2013.01)

(58) Field of Classification Search
CPC ...................................................... H04L 27/20
USPC ........................................................ 455/147
See application file for complete search history.

(56) References Cited

U.S. PATENT DOCUMENTS

2013/0003890 A1\* 1/2013 Schwent et al. ............. 375/296

FOREIGN PATENT DOCUMENTS

| WO | 0203541 A2 | 1/2002 |
|---|---|---|
| WO | 2007055652 A2 | 5/2007 |
| WO | 2008089183 A1 | 7/2008 |

OTHER PUBLICATIONS

Staszewski, R., et al., "Just-In-Time Gain Estimation of an RF Digitally-Controlled Oscillator for Digital Direct Frequency Modulation", Transactions Brief, IEEE Transactions on Circuits and Systems-II: Analog and Digital Signal Processing, Nov. 1, 2003, pp. 887-892, vol. 50, No. 11, IEEE.

(Continued)

*Primary Examiner* — Sanh Phu
(74) *Attorney, Agent, or Firm* — Coats & Bennett, PLLC

(57) ABSTRACT

A wireless communication device (400) is arranged to transmit a transmission signal in an assigned channel bandwidth. The wireless communication device (400) comprises: a local oscillator (460) arranged to generate a local oscillator signal at a local oscillator frequency and a modulator (434) arranged for converting in-phase and quadrature-phase components of a modulation signal at a modulation frequency to a radio frequency by mixing the in-phase and quadrature-phase components with the local oscillator signal. The local oscillator frequency is arranged to place a third order intermodulation product having a frequency equal to the local oscillator frequency minus three times the modulation frequency within the assigned channel bandwidth.

13 Claims, 9 Drawing Sheets

(56) References Cited

OTHER PUBLICATIONS

3rd Generation Partnership Project, "3rd Generation Partnership Project; Technical Specification Group Radio Access Network; Evolved Universal Terrestrial Radio Access (E-UTRA); User Equipment (UE) radio transmission and reception (Release 10)", Technical Specification, 3GPP TS 36.101 V10.5.0, Dec. 1, 2011, pp. 53-67, 3GPP, France.

* cited by examiner

|  | RB allocation | RB allocation start | Output power threshold (dBm) | LO frequency offset (MHz) |
|---|---|---|---|---|
| Conditions A | ≤2 | 43-49 | ≥15dBm | 2 |
| Conditions B | 3-7 | 30-47 | ≥16dBm | 2 |
| Conditions C | 8-17 | 19-42 | ≥20dBm | 2 |

FIG. 6

WIRELESS TRANSMISSION

FIELD OF THE DISCLOSURE

The present disclosure relates to a wireless communication device and a method of controlling a wireless communication device suitable for use, in particular but not exclusively, in a system employing orthogonal frequency division multiplexing (OFDM).

BACKGROUND TO THE DISCLOSURE

The Third Generation Partnership Project Long Term Evolution (3GPP LTE) is a mobile communication standard intended to boost the data rates in cellular networks. 3GPP LTE is also referred to simply as LTE, and is also known as Evolved Universal Terrestrial Radio Access (E-UTRA), an evolution of Universal Terrestrial Radio Access (UTRA). For the uplink of LTE, that is, for transmission from a user equipment (UE) to a base station, Discrete Fourier Transform spread orthogonal frequency division multiplexing (DFTS-OFDM) is used to reduce the peak-to-average power ratio of the signal. A UE is assigned a channel occupying a channel bandwidth, and within the channel bandwidth the UE transmits a DFTS-OFDM signal occupying a transmission bandwidth. The channel bandwidth is divided into resource blocks of equal spectral width, and the UE is allocated a variable number of the resource blocks, the number being updated once every millisecond to adapt to varying channel conditions and to the amount of data to be transmitted by the UE. Therefore, the transmission bandwidth can change each millisecond, depending on the number of resource blocks allocated to the UE. The spectral width of each resource block is 180 kHz, which corresponds to twelve sub-carriers of the DFTS-OFDM signal.

The relationship between resource blocks, transmission bandwidth and channel bandwidth is depicted in FIG. 1. Referring to FIG. 1, the resource blocks may be allocated to different UEs, and the resource blocks assigned to each UE are contiguous in the frequency domain. Therefore, different UEs may simultaneously have different transmission bandwidths. The transmission bandwidth configuration is the maximum number of resource blocks in the channel bandwidth which can be allocated to one or more UEs. The maximum transmission bandwidth is narrower than the channel bandwidth, there being a margin at each end to allow for roll-off of the spectrum of the signal transmitted by the UE.

The 3GPP technical specification TS 36.101, v10.3.0 defines several spectral limits on RF emissions from a UE outside of the assigned channel bandwidth, examples of which are illustrated in FIG. 2. More specifically, an Adjacent Channel Leakage power Ratio (ACLR) is illustrated for UTRA and for E-UTRA. In addition, a network may signal to a UE spurious emission limits, referred to as network signalled (NS) values. The network signalled values NS_03 and NS_07 are illustrated in FIG. 2. NS_07 is an especially stringent limit to meet, necessitating a very linear transmitter. For these examples the assigned channel bandwidth is 10 MHz, extending from 777 MHz to 787 MHz.

Therefore, there is a requirement for a transmitter that can meet demanding constraints on spectral emissions.

SUMMARY OF THE PREFERRED EMBODIMENTS

According to a first aspect, there is provided a wireless communication device arranged to transmit a transmission signal in an assigned channel bandwidth, the wireless communication device comprising: a local oscillator arranged to generate a local oscillator signal at a local oscillator frequency; and a modulator arranged for converting in-phase and quadrature-phase components of a modulation signal at a modulation frequency to a radio frequency by mixing the in-phase and quadrature-phase components with the local oscillator signal; wherein the modulation frequency and the local oscillator frequency is arranged to place a third order intermodulation product having a frequency equal to the local oscillator frequency minus three times the modulation frequency within the assigned channel bandwidth.

According to a second aspect, there is provided a method of controlling a wireless communication device arranged to transmit a transmission signal in an assigned channel bandwidth, the method comprising: generating a local oscillator signal at a local oscillator frequency; and converting in-phase and quadrature-phase components of a modulation signal at a modulation frequency to a radio frequency by mixing the in-phase and quadrature-phase components with the local oscillator signal; wherein the modulation frequency and the local oscillator frequency is arranged to place a third order intermodulation product having a frequency equal to the local oscillator frequency minus three times the modulation frequency within the assigned channel bandwidth.

Therefore, the local oscillator frequency may be selected to position within the assigned channel bandwidth a third order intermodulation product of the mixing of the in-phase and quadrature-phase components of the modulation signal with the local oscillator signal, the local oscillator having a local oscillator frequency $w_{LO}$, the modulation signal, and therefore the in-phase and quadrature-phase components, having a modulation frequency $w_{IQ}$, and the third order intermodulation product having a frequency $w_{LO}-3w_{IQ}$.

Recognising that a cause of spurious emissions is the undesired, out-of-band product of mixing in a transmitter having non-linearity, the applicant has, rather than seeking to reduce the spurious emissions by increasing the linearity of the transmitter, sought a different approach in which the undesired product of mixing is positioned in-band. Positioning the undesired product of mixing in-band is provided by selection of the local oscillator frequency. In this way, by placing the third order intermodulation product having a frequency $w_{LO}-3w_{IQ}$ within the assigned channel bandwidth, it can become easier to comply with out-of band spurious emission limits than if the third order intermodulation product having a frequency $w_{LO}-3w_n$ instead fell outside of the assigned channel bandwidth, thereby enabling a lower cost or simplified communication device. For example, referring to FIG. 2, for an assigned channel bandwidth of 777 MHz to 787 MHz, the network signalled value NS-07 places a constraint of −67 dBm on the RF emissions in the range 769 MHz to 775 MHz, whereas within the assigned channel bandwidth RF emissions may exceed −35 dBm.

The wireless communication device may comprise a controller arranged to place the third order intermodulation product within the assigned channel bandwidth by changing the local oscillator frequency by a local oscillator offset frequency and changing the modulation frequency by a modulation offset frequency equal to and of opposite sign to the local oscillator offset frequency. Likewise, the method may comprise placing the third order intermodulation product within the assigned channel bandwidth by changing the local oscillator frequency by a local oscillator offset frequency and changing the modulation frequency by a modulation offset frequency equal to and of opposite sign to the local oscillator offset frequency. Therefore, if the local oscillator frequency is increased, the modulation frequency is decreased by an equal amount, and if the local oscillator frequency is decreased, the modulation frequency is increased by an equal amount. This feature enables a transmission frequency of the transmission signal to remain constant when placing, that is, positioning, the third order intermodulation product having a frequency $w_{LO}-3w_{IQ}$ within the assigned channel bandwidth requires the local oscillator frequency $w_{LO}$ to be changed.

The wireless communication device may comprise a sample rate converter for changing the modulation frequency by the modulation offset frequency by converting a sample rate of the in-phase and quadrature-phase components of the modulation signal. Likewise, the method may comprise changing the modulation frequency by the modulation offset frequency by converting a sample rate of the in-phase and quadrature-phase components of the modulation signal. The converting, that is, changing, may be increasing or decreasing, according to whether the modulation offset frequency is positive or negative. This feature enables a low complexity adjustment of the modulation frequency.

The wireless communication device may be arranged to vary, within the assigned channel bandwidth, a transmission bandwidth of the transmission signal, and the controller may be arranged to change the local oscillator frequency to place the third order intermodulation product within the assigned channel bandwidth in response to a variation of the transmission bandwidth. Likewise, the method may comprise varying, within the assigned channel bandwidth, a transmission bandwidth of the transmission signal, and changing the local oscillator frequency to place the third order intermodulation product within the assigned channel bandwidth in response to varying the transmission bandwidth.

Therefore, in systems where the transmission bandwidth, that is, the bandwidth occupied by a transmitted signal, is variable, the local oscillator frequency may be controlled dependent on the transmission bandwidth. Consequently, the frequency of the local oscillator signal may be changed to place a third order intermodulation product having a frequency $w_{LO}-3w_{IQ}$ within the assigned channel bandwidth if, due to a change in the transmission bandwidth, the third order intermodulation product may, if left unchanged, fall outside of the assigned channel bandwidth. This feature enables the third order intermodulation product having a frequency $w_{LO}-3w_{IQ}$ to be placed, or maintained, within the assigned channel bandwidth in a system having a variable transmission bandwidth. By changing the frequency of the local oscillator signal only when necessary to maintain the third order intermodulation product having a frequency $w_{LO}-3w_{IQ}$ within the assigned channel bandwidth, the number of changes to the frequency of the local oscillator signal to be reduced, conserving power and reducing processing.

The wireless communication device may be arranged to vary the transmission bandwidth in response to receiving an instruction. Likewise, the method may comprise varying the transmission bandwidth in response to receiving an instruction. This feature enables the transmission bandwidth to be varied under the control of an external device, such as a base station in a mobile communications system, which can enable efficient use of spectrum.

The transmission signal may be an orthogonal frequency division multiplex signal comprising a plurality of sub-carriers, and the wireless communication device may be arranged to vary the transmission bandwidth by varying the number of sub-carriers in the plurality of sub-carriers. Likewise, the transmission signal may be an orthogonal frequency division multiplex signal comprising a plurality of sub-carriers, and the method may comprise varying the transmission bandwidth by varying the number of sub-carriers in the plurality of sub-carriers. This feature enables efficient use of spectrum. In LTE, varying the transmission bandwidth may be the result of varying the resource block allocation of a UE.

The wireless communication device may be arranged to vary the number of sub-carriers in the plurality of sub-carriers at intervals of substantially 1 ms. Likewise, the method may comprise varying the number of sub-carriers in the plurality of sub-carriers at intervals of substantially 1 ms. This feature enables efficient use of spectrum. In LTE, varying the number of sub-carriers may be the result of varying the resource block allocation of a UE.

The controller may be arranged to change the local oscillator frequency to place the third order intermodulation product within the assigned channel bandwidth in response to a variation of a maximum permitted power emission level outside of the assigned channel bandwidth. Likewise, the method may comprise changing the local oscillator frequency to place the third order intermodulation product within the assigned channel bandwidth in response to a variation of a maximum permitted emission level outside of the assigned channel bandwidth. This feature enables efficient use of spectrum. In LTE, the variation of the maximum permitted power emission level outside of the assigned channel bandwidth may be the result of receiving an NS value.

The controller may be adapted to change the local oscillator frequency to place the third order intermodulation product within the assigned channel bandwidth in response to a variation of a transmit power level of the wireless communication device. Likewise, the method may comprise changing the local oscillator frequency to place the third order intermodulation product within the assigned channel bandwidth in response to a variation of a transmit power level of the wireless communication device. This feature enables the number of changes to the frequency of the local oscillator signal to be reduced, thereby conserving power and reducing processing.

The controller may comprise a table of values indicative of the local oscillator frequency suitable for placing the third order intermodulation product within the assigned channel bandwidth, wherein the values indicative of the local oscillator frequency are dependent on at least one of: a/the transmission bandwidth of the transmission signal; a transmission frequency of the transmission signal; a/the maximum permitted power emission level outside of the assigned channel bandwidth; a/the transmit power level of the wireless communication device. Likewise, the method may comprise employing a table indicative of values of the local oscillator frequency suitable for placing the third order intermodulation product within the assigned channel bandwidth, wherein the values indicative of the local oscillator frequency are dependent on at least one of: a/the transmission bandwidth of the transmission signal; a transmission frequency of the transmission signal; a/the maximum permitted power emission level outside of the assigned channel bandwidth; a/the transmit power level of the wireless communication device. This feature enables a low complexity implementation.

The local oscillator may comprise a phase locked loop arranged for two point modulation. This feature enables fast control of the local oscillator frequency.

The phase locked loop may comprise a phase locked loop oscillator having a first switchable capacitance ladder for relatively coarse tuning of the phase locked loop oscillator and a second switchable capacitance ladder for relatively fine tuning of the phase locked loop oscillator. Likewise, the method may comprise relatively coarse tuning of a phase locked loop oscillator by means of a first switchable capacitance ladder and relatively fine tuning of the phase locked loop oscillator by means of a second switchable capacitance ladder. This feature enables increased tolerance to capacitor mismatch.

The phase locked loop may comprise a third switchable capacitance ladder for modulating a frequency of the phase locked loop oscillator. Likewise, the method may comprise modulating a frequency of the phase locked loop oscillator by means of a third switchable capacitance ladder. This feature enables direct modulation of the phase locked loop.

BRIEF DESCRIPTION OF THE DRAWINGS

Preferred embodiments will now be described, by way of example only, with reference to the accompanying drawings, in which:

FIG. 6 is a table indicating the placement of the local oscillator frequency for various conditions;

DETAILED DESCRIPTION OF PREFERRED EMBODIMENTS

One available architecture for implementing an LTE, or other, transmitter is a direct in-phase and quadrature-phase (IQ) up-conversion transmitter. This consists of an IQ-modulator, which converts in-phase (I) and quadrature-phase (Q) signals to a radio frequency (RF). The IQ-modulator converts the I and Q signals from baseband to RF using two Gilbert type mixers. The mixers are supplied with a local oscillator (LO) signal which is a square-wave, or other another waveform containing odd harmonics, and therefore the odd harmonics of the LO signal will be modulated by the I and Q signals. After conversion of the I and Q signals to RF, amplification is needed to deliver sufficient power to an antenna. This amplification can be done using both an on-chip pre-power amplifier (PPA) and a separate dedicated power amplifier (PA).

Figure 3:
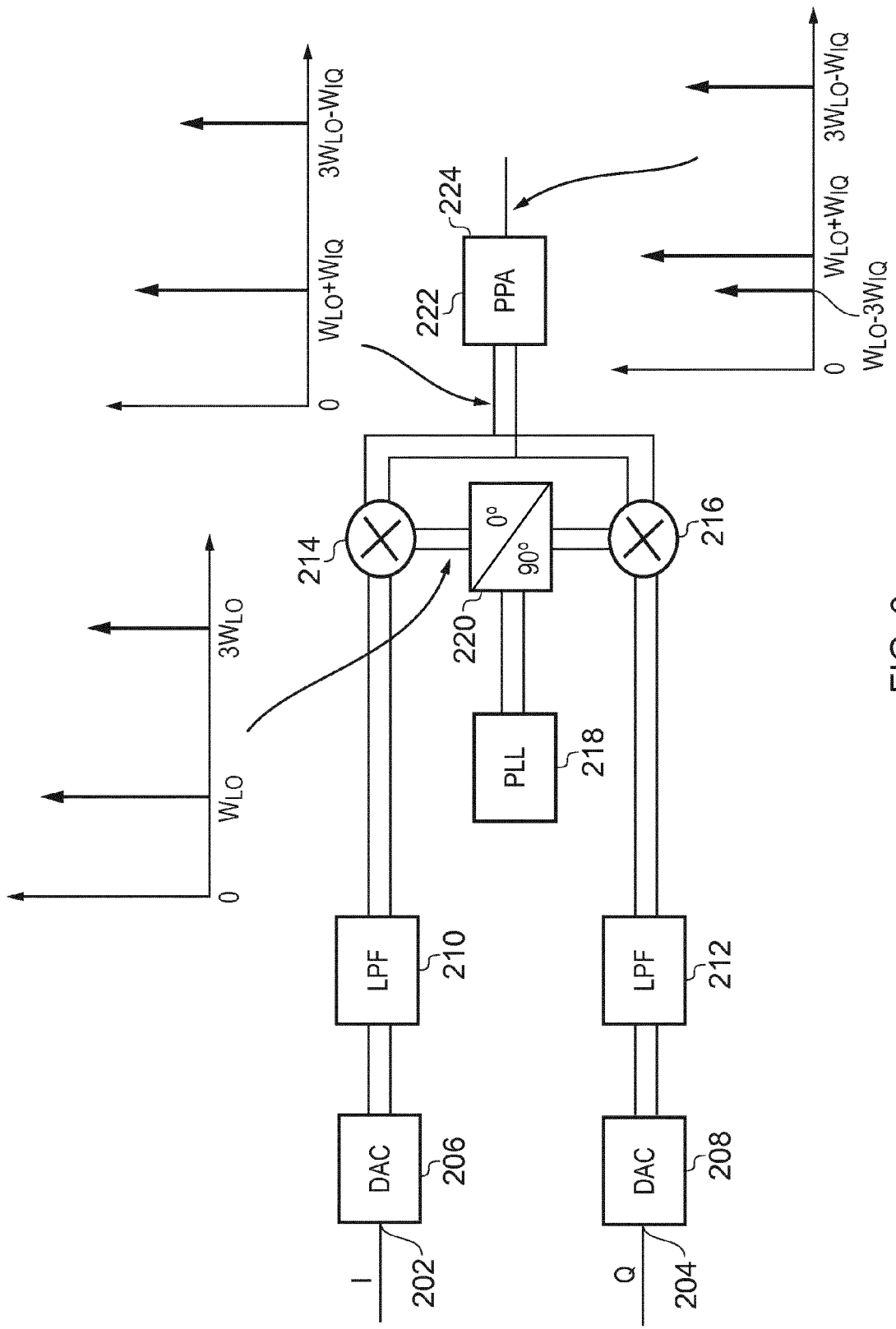
FIG. 3 is a block diagram of part of a direct IQ up-conversion transmitter.

In more detail, referring to FIG. 3, a direct IQ up-conversion transmitter comprises a first digital-to-analogue converter (DAC) 206 for receiving the I signal at a first input 202, and a second DAC 208 for receiving the Q signal at a second input 204. An output of each of the first and second DACs 206, 208 is coupled to, respectively, first and second low pass filters 210, 212. In FIG. 3, the interconnections represented by a double line convey signals in a differential format. An output of each of the first and second low pass filters 210, 212 is coupled to first inputs of, respectively, first and second mixers 214, 216, which constitute a modulator. A phase locked loop (PLL) 218 generates the LO signal. An output of the PLL is coupled to a phase shifting network 220 which provides two versions of the LO signal that have a 90 degree phase difference. The phase shifting network 220 is coupled to respective second inputs of the first and second mixers 214, 216, delivering one of the versions of the LO signal to the first mixer 214, and the other version of the LO signal to the second mixer 216. Outputs of the first and second mixers 214, 216 are coupled to an input of a PPA 222, and an output 224 of the PPA 222 delivers a signal that can be further amplified by a PA (not illustrated) and delivered to an antenna for transmission.

To have good power efficiency, the PPA 222 and the PA should be operated close to saturation. This results in non-linear operation of the PPA 222 and PA, which results in spectral widening. A dominating source of this spectral widening is the third order non-linearity in combination with the output of the IQ-modulator, referred to as the third order intermodulation product. The third order intermodulation product (IM3) may be expressed as:

$$IM3 = (\sin(w_{LO} + W_{IQ}) + \sin(3 \cdot w_{LO} - w_{IQ}))^3$$
$$= \sin^3(w_{LO} + W_{IQ}) + 3 \cdot \sin(w_{LO} + w_{IQ}) \cdot$$
$$\sin^2(3 \cdot w_{LO} - w_{IQ}) + \ldots +$$
$$3 \cdot \sin^2(w_{LO} + w_{IQ}) \cdot \sin(3 \cdot w_{LO} - w_{IQ}) +$$
$$\sin^3(3 \cdot w_{LO} - w_{IQ})$$
$$= \ldots + k \cdot \sin(w_{LO} - 3 \cdot w_{IQ}) \ldots$$

where $w_{LO}$ is the frequency of the LO signal and $w_{IQ}$ is the frequency of the I and Q signals prior to mixing to a radio frequency (RF).

The main spectral components of the LO signal delivered by the phase shifting network 220, the RF signal at the outputs of the first and second mixers 214, 216, and the RF signal after amplification in the PPA 224, are depicted in FIG. 3. The LO signal delivered by the phase shifting network 220 comprises frequencies $w_{LO}$ and $3w_{LO}$, the RF signal at the outputs of the first and second mixers 214, 216 comprises frequencies $w_{LO}+w_{IQ}$ and $3w_{LO}-w_{IQ}$, and the RF signal after amplification in the PPA 224 comprises the frequencies $w_{LO}+w_{IQ}$, $w_{LO}-3w_{IQ}$ and $3w_{LO}-w_{IQ}$. Providing a very linear transmitter having good harmonic rejection during up-conversion, good frequency selectivity in between the modulator and the PPA/PA, or a very linear PPA/PA, in order to reduce the level of the third order intermodulation product can be costly in terms of integrated circuit chip area, current and complexity.

Figure 2:
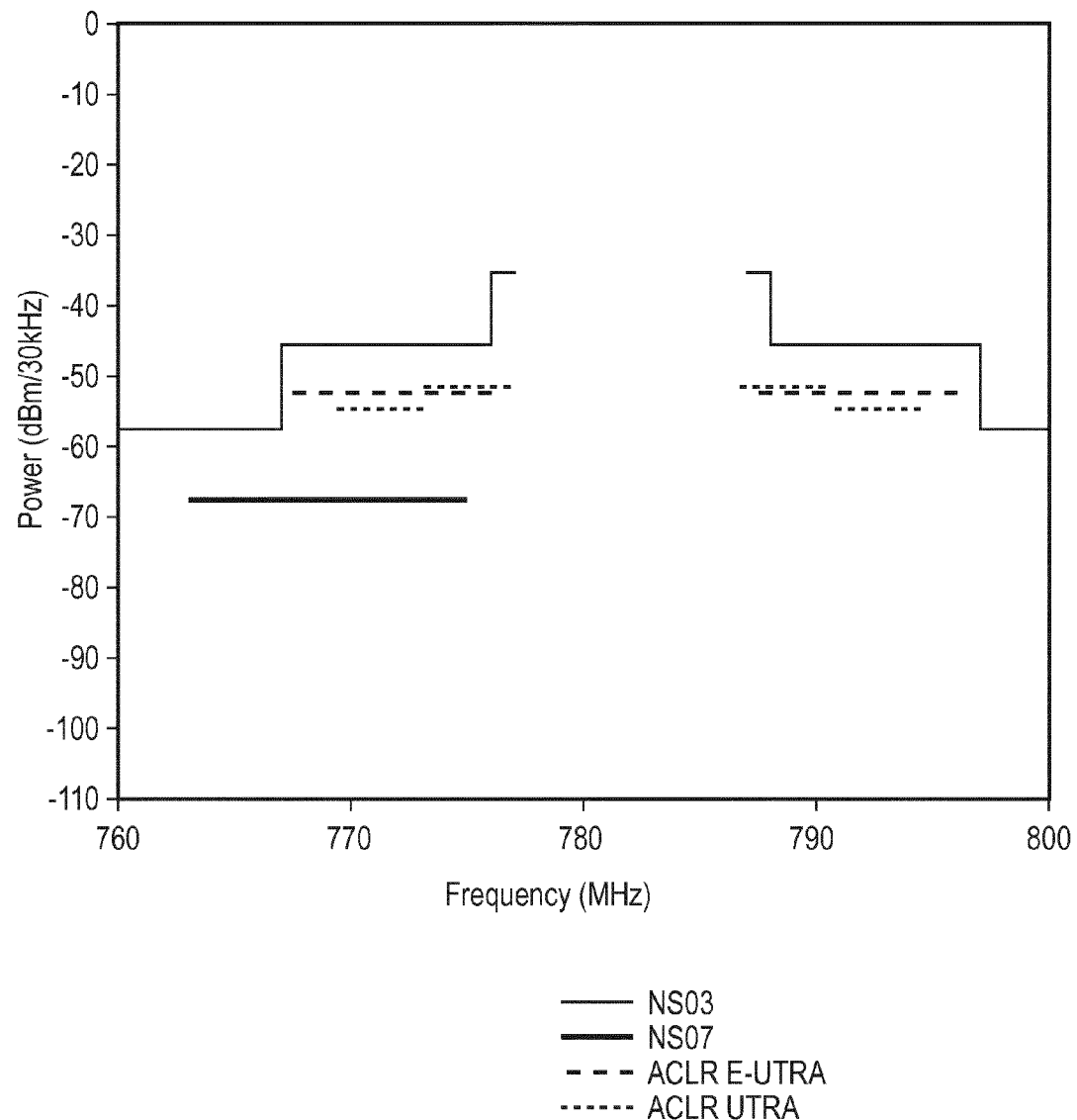
FIG. 2 is a graph illustrating LTE maximum permitted power emission levels.
Figure 4:
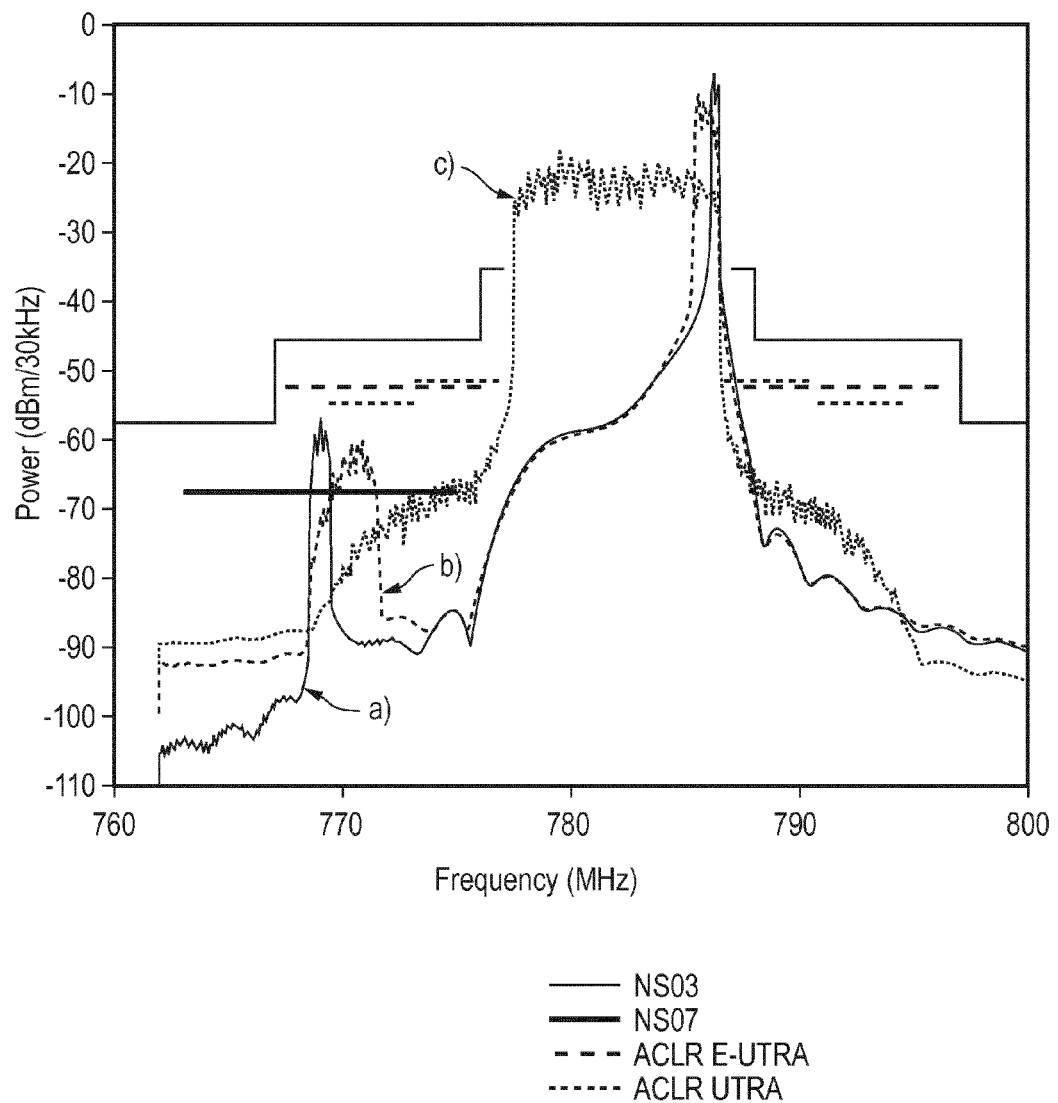
FIG. 4 is a graph illustrating power emission levels.

FIG. 4 reproduces the power emission limits shown in FIG. 2, but additionally shows examples of the spectra of RF signals transmitted by a transmitter that does not have high linearity, for a single allocated LTE resource block in the case of graph a), three allocated resource blocks in the case of graph b), and fifty allocated resource blocks in the case of graph c). The third order non-linearity is manifest as power in the region of 770 MHz, at a lower frequency than the main spectral power around 786 MHz, for the case of one and three resource blocks, and in the case fifty resource blocks the power is spread more widely at a lower level, the total output power being the same. It can be seen in FIG. 4 that the level of spurious emissions, outside of the assigned channel bandwidth of 777 MHz to 787 MHz, is dependent on the number of allocated resource blocks, and is greatest when fewest resource blocks are allocated.

Figure 5:
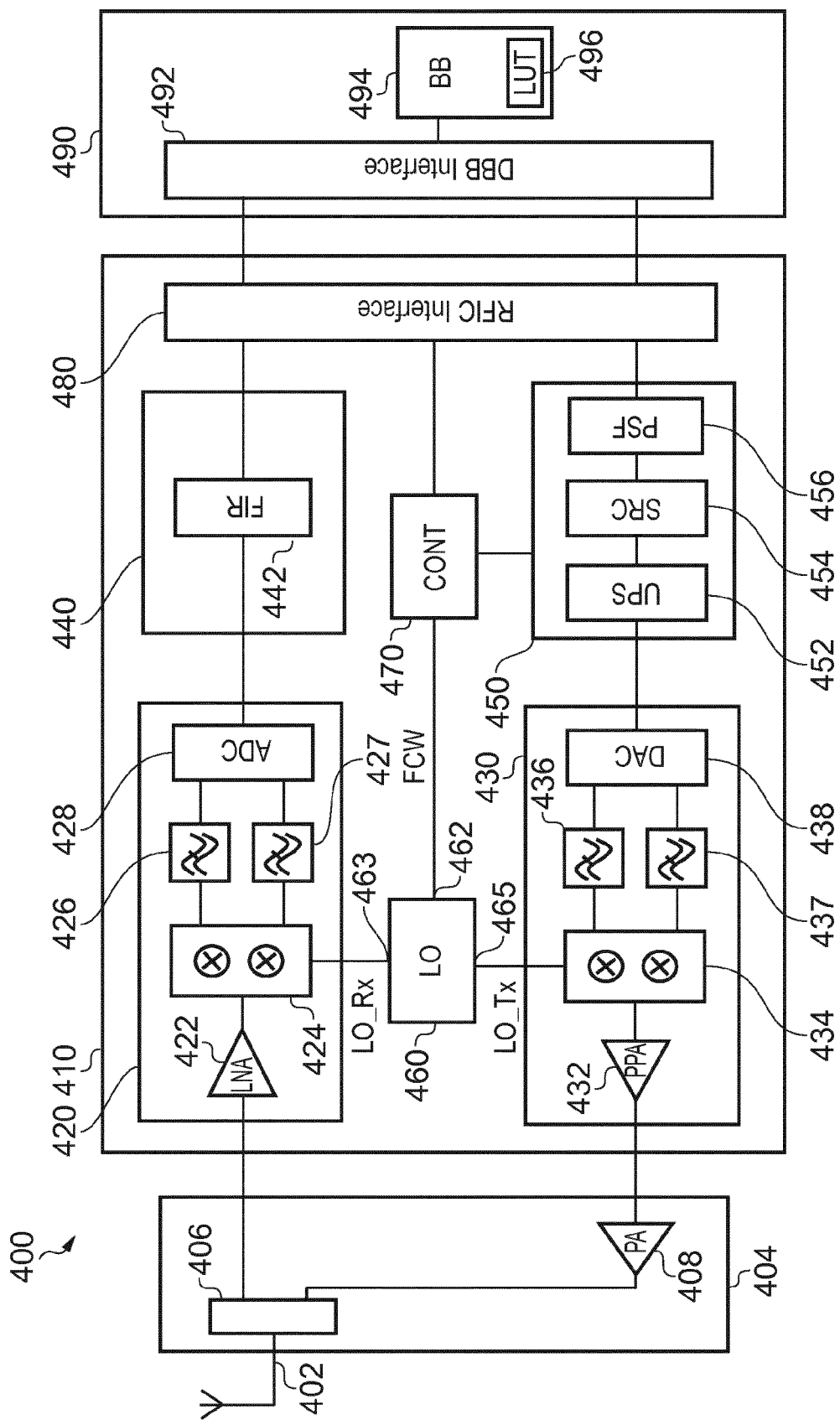
FIG. 5 is a block diagram of a wireless communication device.

Referring to FIG. 5, a wireless communication device 400, suitable for use as a UE in an LTE system, comprises an antenna 402 coupled to a front end module 404, an RF integrated circuit (RFIC) 410 coupled to the front end module 404, and a digital baseband module (DBB) 490 coupled to the RFIC 410. The front end module 404 comprises a duplex filter 406 coupled to the antenna 402 and a power amplifier (PA) 408 coupled to an input of the duplex filter 406. The RFIC 410 comprises a receiver analogue front end 420, a transmitter analogue front end 430, a receiver digital front end 440, a transmitter digital front end 450, a local oscillator (LO) 460, an RFIC controller (CONT) 470 and an RFIC interface 480. The local oscillator 460 may comprise two phase locked loops; one for generating a receiver local oscillator signal and one for generating a transmitter local oscillator signal, as described below with reference to FIG. 8. The DBB 490 comprises a DBB interface 492 and a baseband processor (BB) 494. The wireless communication device 400 therefore comprises a transmitter and a receiver having shared elements. The receiver comprises the receiver analogue front end 420, the receiver digital front end 440, and the shared elements, which are: the antenna 402, the front end module 404, the RFIC interface 480, the DBB interface 492 and the baseband processor 494, the local oscillator 460 and the RFIC controller 470. The transmitter comprises the transmitter digital front end 450, the transmitter analogue front end 430 and the shared elements.

The receiver analogue front end 420 comprises a low noise amplifier (LNA) 422 coupled to an output of the duplex filter 406, and a down-conversion mixer 424 coupled to an output of the low noise amplifier 422 and to a first output 463 of the local oscillator 460. The local oscillator 460 delivers a receiver local oscillator signal (LO_Rx) at the first output 463 of the local oscillator 460 for down-converting a received signal at RF to provide in-phase and quadrature-phase received signal components at baseband. The receiver analogue front end 420 also comprises first and second receiver low pass filters 426, 427 coupled to respective outputs of the down-conversion mixer 424 for filtering the in-phase and quadrature-phase received signal components, a dual analogue-to-digital converter (ADC) 428 for digitising the in-phase and quadrature-phase received signal components after filtering by the first and second receiver low pass filters 426, 427. The receiver digital front end 440 comprises a digital filter 442 coupled to an output of the ADC 428 for filtering the digitised in-phase and quadrature-phase received signal components. The RFIC interface 480 is coupled to an output of the digital filter 442, and is coupled to the DBB interface 492 for delivering to the digital baseband module 490 the in-phase and quadrature-phase received signal components after filtering by the digital filter 442. The DBB interface 492 is coupled to the baseband processor (BB) 494 which receives and decodes the in-phase and quadrature-phase baseband received signal components.

The baseband processor 494 also encodes and modulates a signal for transmission, delivering in-phase and quadrature-phase transmit signal components of a modulation signal, as samples in the digital domain at baseband, to the DBB interface 492. The modulation signal, and therefore the in-phase and quadrature-phase transmit signal components of the modulation signal, are at a modulation frequency $w_{IQ}$. The DBB interface 492 is coupled to the RFIC interface 480 for delivering the in-phase and quadrature-phase transmit signal components to the RFIC 410. The transmitter digital front end 450 comprises a pulse shaping filter (PSF) 456 coupled to the RFIC interface 480 for low pass filtering in the digital domain the in-phase and quadrature-phase transmit signal components, a sample rate converter (SRC) 454 coupled to an output of the pulse shaping filter (PSF) 456 for applying frequency correction to the in-phase and quadrature-phase transmit signal components, and an up-sampler (UPS) 452 coupled to an output of the sample rate converter (SRC) 454 for increasing the data rate of the in-phase and quadrature-phase transmit signal components in order to relax the filtering required in the analogue domain. The transmitter analogue front end 430 comprises a dual digital-to-analogue converter (DAC) 438 coupled to the up-sampler 452 for converting the in-phase and quadrature-phase transmit signal components to the analogue domain, first and second transmitter low pass filters 436, 437 coupled to the DAC 438 for filtering the analogue domain in-phase and quadrature-phase transmit signal components. The transmitter analogue front end 430 also comprises a modulator 434 coupled to outputs of the first and second transmitter low pass filters 436, 437 and to a second output 465 of the local oscillator 460. The local oscillator 460 delivers a transmitter local oscillator signal (LO_Tx) at the second output 465 of the local oscillator 460 for up-converting the in-phase and quadrature-phase transmit signal components which are then combined by the modulator 434 to provide an RF transmission signal. The local oscillator signal LO_Tx is at a local oscillator frequency $w_{LO}$. The transmitter analogue front end 430 also comprises a pre-power-amplifier (PPA) 432 coupled to the modulator 434 for amplifying the transmission signal.

The power amplifier 408 is coupled to an output of the pre-power-amplifier 432 for further amplifying the transmission signal, and for delivering the transmission signal to the duplex filter 406 prior to propagation from the antenna 402.

The RFIC controller 470 is coupled to a control input 462 of the local oscillator 460, to the RFIC interface 480, and to the transmitter digital front end 450, for controlling the operation of these elements as described below.

The wireless communication device 400 transmits a signal in an assigned channel bandwidth at an assigned frequency. The assigned channel bandwidth may be determined at manufacture and, for a wireless communication device 400 capable of transmitting in more than one frequency band, the assigned channel bandwidth may have a value dependent on the frequency band in which it is required to transmit. In some embodiments, such as for use in LTE, the assigned frequency may be assigned by means of control signalling from a base station, although in other embodiments the assigned frequency may be assigned, for example, at manufacture or at commissioning for operation of the wireless communication device 400.

The RFIC controller 470 controls the frequency of the transmitter local oscillator signal LO_Tx and the receiver local oscillator signal LO_Rx by means of a frequency control words (FCW), although in other embodiments the frequency of the transmit and receive local oscillator signals LO_Tx, LO_Rx may be constant. The frequency control words comprise transmitter frequency control word (FCW_Tx) for controlling the frequency of the transmitter local oscillator signal LO_Tx, and a receiver frequency control word (FCW_Rx) for controlling the frequency of the receiver local oscillator signal LO_Rx. In particular, the RFIC controller 470 is able to control the frequency of the transmitter local oscillator signal LO_Tx to place a third order intermodulation product having a frequency $w_{LO}-3w_{IQ}$, that is, equal to the frequency of the transmitter local oscillator signal LO_Tx minus three times the frequency of the modulation signal, within the assigned channel bandwidth. It is not essential under all circumstances for the RFIC controller 470 to control the frequency of the transmitter local oscillator signal LO_Tx to place the third order intermodulation product having a frequency $w_{LO}-3w_{IQ}$ within the assigned channel bandwidth. For example, if the third order intermodulation product having a frequency $w_{LO}-3w_{IQ}$ lay outside the assigned channel bandwidth and the level of RF power emitted outside of the assigned channel bandwidth is below the maximum permitted level, then the transmit local oscillator frequency need not be changed. The need to place the third order intermodulation product having a frequency $w_{LO}-3w_{IQ}$ within the assigned channel bandwidth may be dependent on one or more of the following factors: the number of resource blocks, number of sub-carriers, or more generally the transmission bandwidth, used by the wireless communication device 400 for transmitting; the position of the resource blocks used by the wireless communication device 400 within the assigned channel bandwidth; the maximum permitted power emission level outside of the assigned channel bandwidth; the transmit power of the wireless communication device 400. Each of these factors are described below.

a) the Number of Resource Blocks, Number of Sub-Carriers, or More Generally the Transmission Bandwidth, Used by the Wireless Communication Device for Transmitting.

The number of resource blocks, number of sub-carriers or transmission bandwidth can affect the level of power emitted outside of the assigned channel bandwidth resulting from the third order intermodulation product having a frequency $w_{LO}-3w_{IQ}$, as illustrated in FIG. 2. Therefore, the RFIC controller 470 may be arranged to control the frequency of the transmitter local oscillator signal LO_Tx to place the third order intermodulation product having a frequency $w_{LO}-3w_{IQ}$ within the assigned channel bandwidth in response to a variation of the number of resource blocks, number of sub-carriers or transmission bandwidth. The number of resource blocks, number of sub-carriers or transmission bandwidth used by a wireless communication device 400 or UE may be controlled by means of an instruction or indication, received from a base station, allocating a number of resource blocks, number of sub-carriers or a transmission bandwidth, or specifying another parameter affecting transmission bandwidth, such as modulation scheme or bit rate. Therefore, such a variation of the number of resource blocks, number of sub-carriers or transmission bandwidth may be in response to receiving an instruction. The number of resource blocks, and consequently the number of sub-carriers, allocated to a UE in LTE may change at intervals of 1 ms. Therefore, for operation in an LTE system, the wireless communication device 400 can be arranged to vary the number of resource blocks, number of sub-carriers or transmission bandwidth at intervals of substantially 1 ms.

b) the Position, that is, the Frequency, of the Resource Blocks Used by the Wireless Communication Device within the Assigned Channel Bandwidth.

Figure 1:
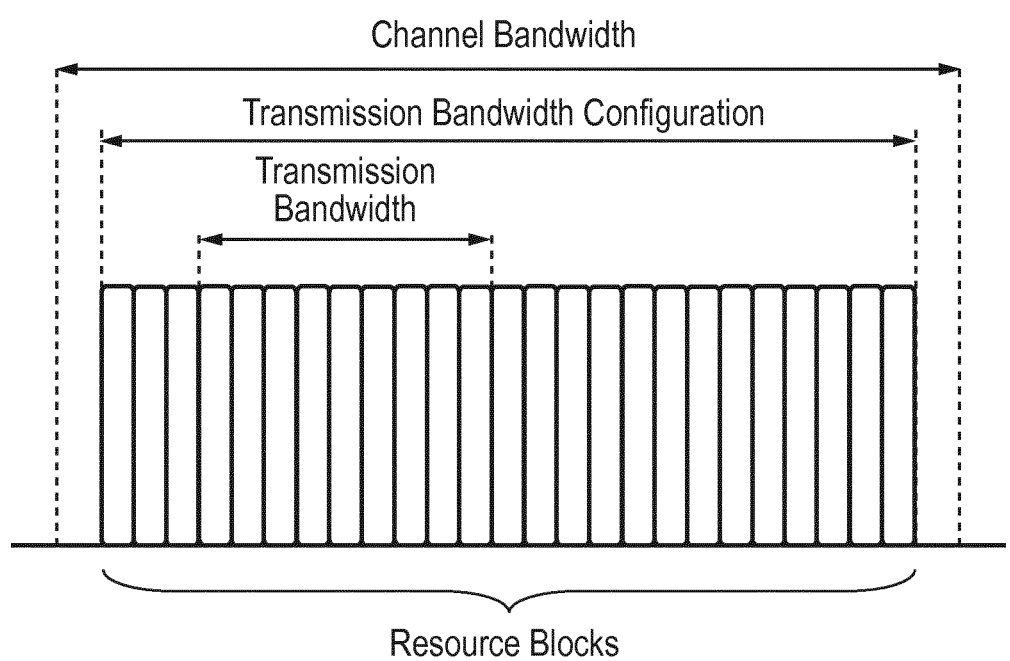
FIG. 1 is a diagram depicting the LTE channel bandwidth, transmission bandwidth, transmission bandwidth configuration and resource blocks.

The resource blocks used by the wireless communication device 400 may depend on the availability of resource blocks, which may depend on the resource blocks being used by other such wireless communication devices in an LTE system. So, for example, if the wireless communication device 400 is allocated a single resource block, that single resource block may be any one of the resource blocks contained within the transmission bandwidth configuration illustrated in FIG. 1, and if the wireless communication device 400 is allocated three resource blocks, these may be any consecutive, that is adjacent, resource blocks within the transmission bandwidth configuration illustrated in FIG. 1. Some allocations of resource blocks may be at a frequency close to an edge of the assigned channel bandwidth, whereas other allocations of resource blocks may be at a frequency at or near the centre of the assigned channel bandwidth. Therefore, the frequency of the local oscillator signal, and consequently the frequency of the third order intermodulation product having a frequency $w_{LO}-3w_{IQ}$, may depend on the frequency of the allocated resource blocks. Consequently, the frequency of the allocated resource blocks may affect whether the third order intermodulation product having a frequency $w_{LO}-3w_{IQ}$ falls outside of, and if so how far outside of, the assigned channel bandwidth.

c) the Maximum Permitted Power Emission Level Outside of the Assigned Channel Bandwidth.

In circumstances where the wireless communication device 400 is permitted to emit a relatively high level of power outside of the assigned channel bandwidth, the wireless transmitter 400 may operate with the frequency of the transmitter local oscillator signal LO_Tx, under the control of the RFIC controller 470 set such that the third order intermodulation product having a frequency $w_{LO}-3w_{IQ}$, falls outside of the assigned channel bandwidth. In contrast, in circumstances where the wireless communication device 400 is required to emit a relatively low level of power outside of the assigned channel bandwidth, the RFIC controller 470 may control the frequency of the transmitter local oscillator signal LO_Tx to place the third order intermodulation product having a frequency $w_{LO}-3w_{IQ}$ inside of the assigned channel bandwidth. The maximum permitted power emission level outside of the assigned channel bandwidth may depend on the transmission frequency of the wireless transmitter 400, so a change of transmission frequency may result in a variation of the maximum permitted power emission level outside of the assigned channel bandwidth, and consequently a change in the frequency of the transmitter local oscillator signal LO_Tx to place the third order intermodulation product having a frequency $w_{LO}-3w_{IQ}$ within the assigned channel bandwidth. Moreover, a change of the maximum permitted power emission level outside of the assigned channel bandwidth may be signalled to the wireless communication device 400 by a base station, for example by the network signalled values of ACLR in LTE, such as NS_03 and NS_07 illustrated in FIG. 2, which may result in a variation of the maximum permitted power emission level outside of the assigned channel bandwidth, and consequently a change in the frequency of the transmitter local oscillator signal LO_Tx to place the third order intermodulation product having a frequency $w_{LO}-3w_{IQ}$ within the assigned channel bandwidth.

d) the Transmit Power of the Wireless Communication Device.

In circumstances where the transmit power of the wireless communication device 400 is relatively low the power emitted outside of the assigned channel bandwidth may also be relatively low, in which case the wireless communication device 400 may comply with the maximum permitted power emission level outside of the assigned channel bandwidth even if the third order intermodulation product having a frequency $w_{LO}-3w_{IQ}$ is outside of the assigned channel bandwidth, in which case the frequency of the transmitter local oscillator signal LO_Tx may remain unchanged. However, if the transmit power of the wireless communication device 400 is relatively high, the power emitted outside of the assigned channel bandwidth may also be relatively high, in which case the wireless communication device 400 may not comply with the maximum permitted power emission level outside of the assigned channel bandwidth unless the third order intermodulation product having a frequency $w_{LO}-3w_{IQ}$ is moved within the assigned channel bandwidth, by changing the frequency of the transmitter local oscillator signal LO_Tx under the control of the RFIC controller 470. Therefore, the RFIC controller 470 may be arranged to control the frequency of the transmitter local oscillator signal LO_Tx to place the third order intermodulation product having a frequency $w_{LO}-3w_{IQ}$ within the assigned channel bandwidth in response to a variation of the transmit power level of the wireless transmitter 400. The transmit power level of the wireless transmitter 400 may be varied by the wireless transmitter 400 either autonomously or in response to, for example, a power control command received from a base station.

Therefore, the feature of controlling the frequency of the transmitter local oscillator signal LO_Tx to place the third order intermodulation product having a frequency $w_{LO}-3w_{IQ}$ within the assigned channel bandwidth may be employed when required to reduce the level of RF power emitted outside of the assigned channel bandwidth below the maximum permitted level.

The RFIC controller 470 controls the frequency of the transmitter local oscillator signal LO_Tx under instruction from the base band processor 494. In order to determine whether to change the frequency of the transmitter local oscillator signal LO_Tx in order to place the third order intermodulation product having a frequency $w_{LO}-3w_n$ within the assigned channel bandwidth, the base band processor 494 comprises a look-up table (LUT) 496. The look-up table 472 is a table of values indicative of the frequency of the transmitter local oscillator signal LO_Tx suitable for placing the third order intermodulation product having a frequency $w_{LO}-3w_n$ within the assigned channel bandwidth. Such values may be, for example, values of the transmitter frequency control word FCW_Tx, increments in the transmitter frequency control word FCW_Tx, absolute values of the frequency of the transmitter local oscillator signal LO_Tx, or a shift in the frequency of the transmitter local oscillator signal LO_Tx. The values may be dependent on at least one of the factors described above, in particular at least one of: the transmission bandwidth of the transmission signal; a transmission frequency of the transmission signal; the transmit power level of the wireless communication device 400; and the maximum permitted power emission level outside of the assigned channel bandwidth. In this way, the values in the look-up table 472 are indicative of, or representative of, conditions, or sets of conditions, under which the RFIC controller 470 controls the frequency of the transmitter local oscillator signal LO_Tx to place the third order intermodulation product having a frequency $w_{LO}-3w_{IQ}$ within the assigned channel bandwidth.

Referring to FIG. 6, an example of the look-up table 472 comprises, in the fifth column, values of a shift in the frequency of the transmitter local oscillator signal LO_Tx, that is, values of a transmitter local oscillator offset frequency, or simply local oscillator offset frequency, specifically 2 MHz, from a default frequency, required under three sets of conditions denoted A, B and C. The first set of conditions, conditions A, relate to the wireless communication device 400 when allocated one or two resource blocks, as indicated in the second column, commencing in the range resource block 43 to resource block 49, as indicated in the third column, when the wireless communication device 400 transmits at a transmit power level of at least 15 dBm, as indicated in the fourth column. The second set of conditions, conditions B, relate to the wireless communication device 400 when allocated from three to seven resource blocks, commencing in the range resource block 30 to resource block 47, when the wireless communication device 400 transmits at a transmit power level of at least 16 dBm. The third set of conditions, conditions C, relate to the wireless communication device 400 when allocated from eight to seventeen resource blocks, commencing in the range resource block 19 to resource block 42, when the wireless communication device 400 transmits at a transmit power level of at least 20 dBm. More generally, the look-up table 472 may comprise any number of conditions, or sets of conditions, and the conditions may relate to any factor or factors that affect the level and frequency of the third intermodulation product having a frequency $w_{LO}-3w_n$ frequency.

In particular, the conditions may provide hysteresis to reduce the frequency at which the local oscillator frequency is changed. Moreover, sets of conditions may be provided corresponding to different NS limits.

Figure 7:
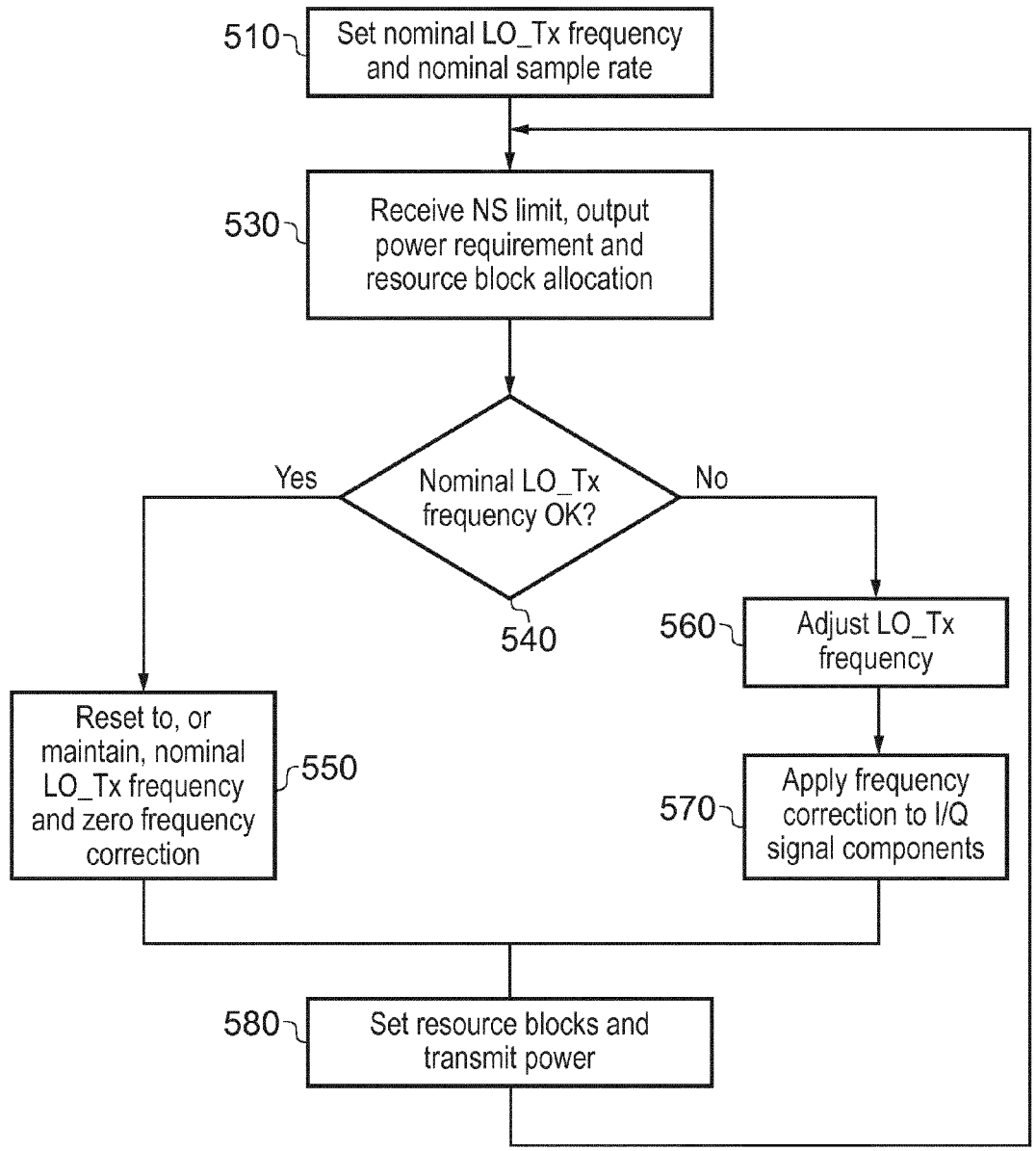
FIG. 7 is a flow chart illustrating operation of a wireless communication device.

The flow chart of FIG. 7 illustrates operation of the wireless communication device 400 when an allocation of resource blocks is changed during transmission of a transmission signal. Referring to FIG. 7, at step 510 the baseband processor 494 instructs the RFIC controller 470 to set the frequency of the transmitter local oscillator signal LO_Tx to a nominal, or default, frequency. With the transmitter local oscillator signal LO_Tx set to the nominal frequency, the third order intermodulation product having a frequency $w_{LO}-3w_{IQ}$ is, for the initially allocated resource blocks, outside of the assigned channel bandwidth. Also at step 510, the baseband processor 494 instructs the RFIC controller 470 to set the frequency correction applied by the sample rate converter 454 to zero, that is, preserving the nominal, or default, sample rate established for the in-phase and quadrature-phase transmit signal components by the baseband processor 494. At step 530, the wireless communication device 400 receives from a base station a network signalled, NS, limit on spurious emissions, such as NS_07, a transmitter output power requirement, and a changed allocation of resource blocks. The NS limit, transmitter output power requirement and the allocation of resource blocks are contained in instructions received from a base station, and are decoded in the baseband processor 494, and used by the baseband processor 494 to instruct the RFIC controller 470 via the DBB interface 492 and the RFIC interface 480.

At step 540, the baseband processor 494 determines whether, for the allocated resource blocks, the received NS limit can be complied with using the nominal LO_Tx frequency, that is, determines whether the linearity of the transmit path of the wireless communication device 400 is sufficient to enable compliance with the received NS limit. This determination is made by reference to the values stored in the look-up table 496. If it is determined that the received NS limit can not, or may not, be complied with using the nominal LO_Tx frequency, flow proceeds to step 560 where, the transmitter local oscillator signal LO_Tx is adjusted to place the third order intermodulation product having a frequency $w_{LO}-3w_{IQ}$ within the assigned channel bandwidth by changing the frequency of the transmitter local oscillator signal LO_Tx by the local oscillator offset frequency. If no further adjustment is made, the change of frequency of the transmitter local oscillator signal LO_Tx will result in an undesired change of the transmission frequency at RF from its nominal value. In order to ensure no change of the transmission frequency at RF, that is, to ensure that the nominal transmission frequency is maintained, at step 570 frequency correction is applied to the in-phase and quadrature-phase transmit signal components by the sample rate converter 454. The frequency correction is applied by changing the sample rate of the in-phase and quadrature-phase transmit signal components by a modulation frequency offset which is equal in magnitude, but of opposite sign to, the local oscillator offset frequency. Therefore, if the frequency of the transmitter local oscillator signal LO_Tx is increased at step 560 by the local oscillator offset frequency, at step 570 the sample rate of the in-phase and quadrature-phase transmit signal components is decreased by the sample rate converter 454 by the modulation offset frequency equal in magnitude the local oscillator offset frequency, thereby decreasing the modulation frequency $w_{IQ}$ by the same amount. Conversely, if the frequency of the transmitter local oscillator signal LO_Tx is decreased at step 560 by the local oscillator offset frequency, at step 570 the sample rate of the in-phase and quadrature-phase transmit signal components is increased by the sample rate converter 454 by the modulation offset frequency equal in magnitude the local oscillator offset frequency, thereby increasing the modulation frequency $w_{IQ}$ by the same amount. In other embodiments, the frequency correction may be applied by the baseband processor 494.

If, at step 540, it is determined that the received NS limit can be complied with using the nominal LO_Tx frequency, flow proceeds to step 550 where the LO_Tx is reset to the nominal LO_Tx frequency, or maintained at the nominal LO_Tx frequency if already at that frequency, and the frequency correction applied by the sample rate converter 454 is reset to zero, if not already zero.

From steps 550 and 570, flow proceeds to step 580 where baseband controller 494 employs the allocated resource blocks for transmission and sets the transmit power of the power amplifier 408 according to the received transmitter output power requirement. Flow then returns to step 530 in readiness to receive another NS limit, transmitter output power requirement and allocation of resource blocks.

As a numerical example, consider the case of an assigned channel bandwidth of 10 MHz centred on 782 MHz, extending from 777 MHz to 787 MHz, and the wireless communication device 400 in which the nominal frequency of the transmitter local oscillator signal LO_Tx is at 782 MHz, in the middle of the assigned channel bandwidth. The centre frequency of the transmission signal depends on the number of allocated resource blocks and the position of the allocated resource blocks within the assigned channel bandwidth. As a worst case scenario, for a single allocated resource block, and in-phase and quadrature-phase transmit signal components of the modulation signal at 4 MHz, the centre frequency, that is, transmission frequency, of the transmission signal may be $w_{LO}+w_{IQ}=782+4$ MHz=786 MHz. In this case, the third order intermodulation product $w_{LO}-3w_{IQ}$ of the transmit signal is, as illustrated in FIG. 2, at 782−3×4 MHz=770 MHz, which is outside of the assigned channel bandwidth, and therefore is required to be compliant with the stringent NS-07 limit. By increasing the frequency of the transmit local oscillator LO_Tx by a local oscillator offset frequency of 2 MHz to 784 MHz, and correspondingly reducing the frequency of the baseband in-phase and quadrature-phase transmit signal components by a modulation offset frequency of 2 MHz to ensure that the transmission frequency of the transmit signal is unchanged at 786 MHz, the third order intermodulation product at the frequency $w_{LO}-3w_{IQ}$ becomes 784−3×2 MHz=778 MHz, which is within the assigned channel bandwidth. Consequently, the third order intermodulation product having a frequency $w_{LO}-3w_{IQ}$ is no longer at a frequency where it is required to be compliant with the NS_07 limit.

In order to be compliant with the LTE specifications, the wireless communication device 400 must be capable of changing allocated resource blocks at intervals of 1 ms. Furthermore, a window of 40 μs is provided for changing allocated resource blocks, although a base station may use part of this window. Therefore, to be on the safe side, for operation in an LTE system, the change of allocated resource blocks by the wireless communication device 400 should be performed in about 5.1 μs. Therefore, for operation in an LTE system, to allow a very fast switching time without compromising other phase locked loop requirements, such as phase noise performance and loop stability, a two point phase locked loop, that is, a phase locked loop having an architecture adapted for two point modulation, may be used for generating the transmitter local oscillator signal LO_Tx.

Figure 8:
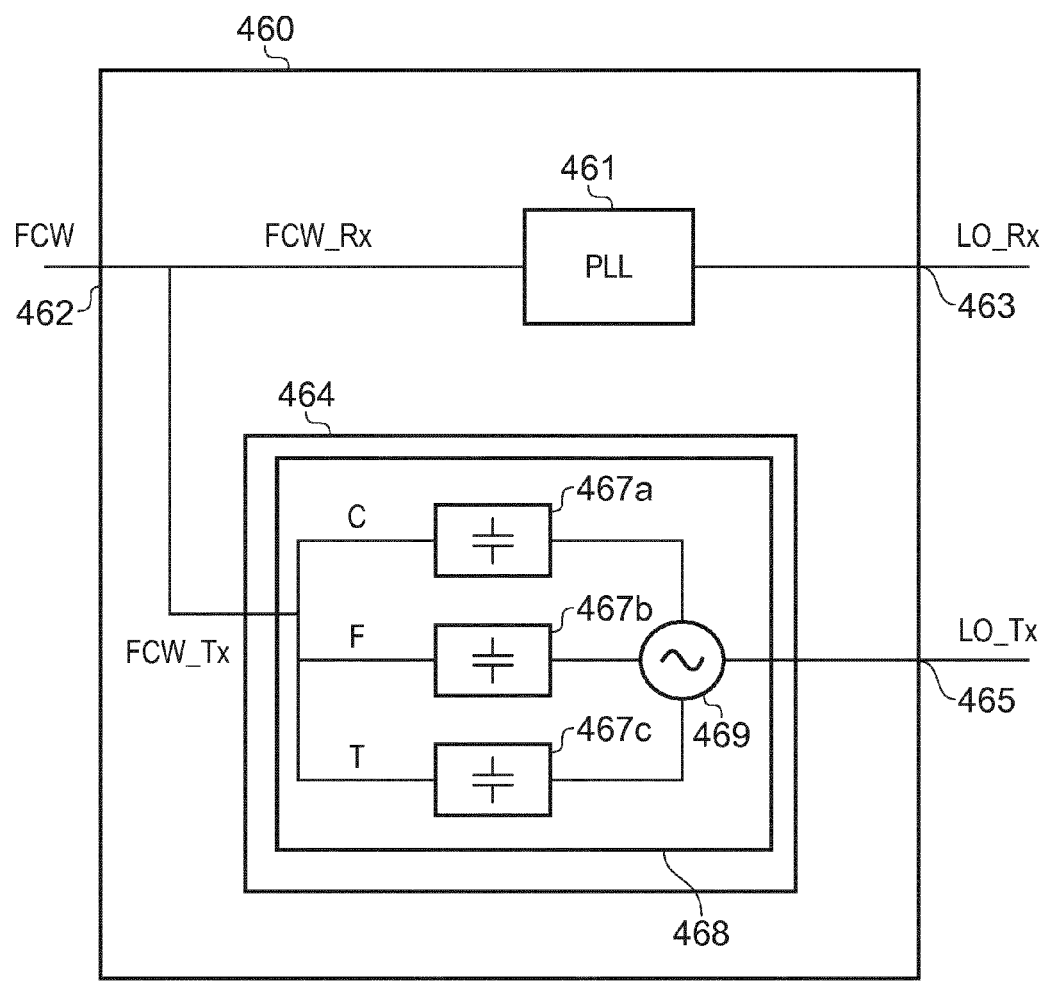
FIG. 8 is a block diagram of a local oscillator.

A suitable architecture for the local oscillator 460 for use in LTE is illustrated in FIG. 8. Referring to FIG. 8, the local oscillator 460 comprises a first phase locked loop 461 for generating the receiver local oscillator signal LO_Rx for down-converting the received signal in the down-conversion mixer 424 and a second phase locked loop 464 for generating the transmitter local oscillator signal LO_Tx for up-converting the in-phase and quadrature-phase transmit signal components in the modulator 424. The control input 462 of the local oscillator 460 is coupled to the first phase locked loop 461 for controlling the frequency of the receiver local oscillator signal LO_Rx by means of the receiver frequency control word FCW_Rx, and an output of the first phase locked loop 461 is coupled to the first output 463 of the local oscillator 460 for delivering the receiver local oscillator signal LO_Rx. The control input 462 of the local oscillator 460 is also coupled to the second phase locked loop 464 for controlling the frequency of the transmitter local oscillator signal LO_Tx by means of the transmitter frequency control word FCW_Tx, and an output of the second phase locked loop 464 is coupled to the second output 465 of the local oscillator 460 for delivering the transmitter local oscillator signal LO_Tx.

The second phase locked loop 464 comprises a phase locked loop (PLL) oscillator 468, which is a digitally controlled oscillator (DCO) having an oscillator circuit 469 coupled to a first capacitive ladder 467a, a second capacitive ladder 467b and a third capacitive ladder 467c. The first, second and third capacitive ladders 467a, 467b, 467c are coupled to the control input 462 of the local oscillator 460, and an output of the oscillator circuit 469 is coupled to the second output 465 of the local oscillator 460. The first capacitive ladder 467a provides coarse control of the frequency of the PLL oscillator 468 in response to C bits of the transmitter frequency control word FCW_Tx, and is also referred to below as a coarse tuning ladder 467a. The second capacitive ladder 467b provides fine control of the frequency of the PLL oscillator 468 in response to F bits of the transmitter frequency control word FCW_Tx. The third capacitive ladder 467c is employed for frequency tracking and modulation of the PLL oscillator 468 in response to T bits of the transmitter frequency control word FCW_Tx. For example, the third capacitive ladder 467a may provide coarse tuning over 32 steps of 4 MHz using C=5 bits, the second capacitive ladder 467b may provide fine tuning over 32 steps of 200 kHz using F=5 bits, and the third capacitive ladder 467c may provide frequency tracking and modulation over 64 steps of 10 kHz using T=6 bits. The tuning ranges provided by the first, second and third capacitive ladders 467a, 467b, 467c may overlap.

The capacitance ratio of the first, second and third capacitive ladders 467a, 467b, 467c need not be well defined. To relax the requirement of capacitor matching, the first capacitive ladder 467a may be used in combination with the second capacitive ladder 467b for initial coarse tuning of the PLL oscillator 468, and the third capacitive ladder 467c, or alternatively a linear input, may be used for frequency tracking and modulation of the PLL oscillator 468. The third capacitive ladder 467c may have a very narrow range of capacitance values in order to avoid noise injection, where the second phase locked loop 464 is an analogue phase locked loop, and to fulfil stringent mismatch requirements where the second phase locked loop 464 is a digital phase locked loop.

Figure 9:
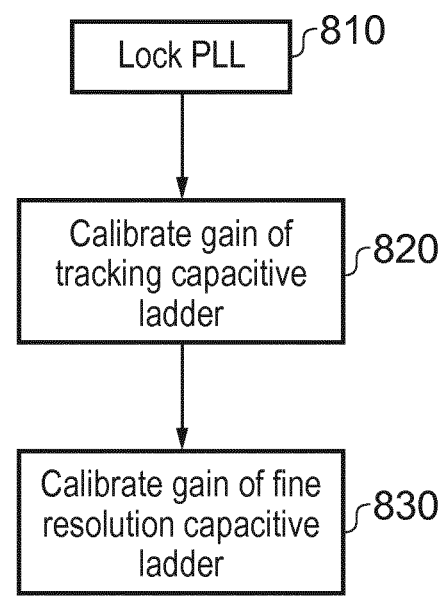
FIG. 9 is a flow chart for calibration of a phase locked loop.

A poorly defined capacitance ratio may be overcome in the second phase locked loop 464, which is a two point phase locked loop, by measuring and calibrating the gain of the first, second and third capacitive ladders 467a, 467b, 467c. If, for example, the gain difference between the two modulation paths is tuned to, for example, within 1% by calibration, application of the same modulation signal at both phase locked loop inputs enables a small step in the frequency of the PLL oscillator 468, corresponding to the residual gain difference in the two modulation paths, thereby enabling the second phase locked loop 464 to cover a wide frequency range with a high frequency resolution. Such a small step in the frequency of the PLL oscillator 468 can be inside the linear range of the second phase locked loop 464, and therefore relocking of the second phase locked loop 464 to a different frequency can be much faster. An example of a calibration routine is illustrated in FIG. 9. This calibration routine may be performed under the control of the RFIC controller 470.

Referring to FIG. 9, at step 810 the second phase locked loop 464 is locked using the third capacitive ladder 467c. At step 820, the gain of the second phase locked loop 464 with the third capacitive ladder 467c is determined. This entails selecting two capacitance values of the third capacitive ladder 467c, one each side of the capacitance value employed in step 810 for the third capacitive ladder 467c, locking the second phase locked loop 464 with each of the two selected capacitance values, and calculating the gain of the second phase locked loop with the third capacitive ladder 467c as the ratio of the difference in phase locked loop frequency to the difference in capacitance of the two selected capacitance values. At step 830, the gain of the second phase locked loop 464 with the second capacitive ladder 467b is determined. This entails selecting two capacitance values of the second capacitive ladder 467b, one each side of the capacitance value employed in step 810 for the third capacitive ladder 467c, locking the second phase locked loop 464 with each of these two selected capacitance values, and calculating the gain of the second phase locked loop 464 with the second capacitive ladder 467c as the ratio of the difference in phase locked loop frequency to the difference in capacitance of the two selected capacitance values.

To relax the requirement for capacitor matching and to relax the tracking frequency range, the second capacitive ladder 467b, and potentially the first capacitive ladder 467a, may be used in parallel to the third capacitive ladder 467c. In this case, additional steps may be added to the calibration routine illustrated in FIG. 9 to calibrate the relative gain of the two modulation paths of the second phase locked loop 464 for each capacitive ladder used. The calibration routine can be performed before the transmission starts when timing is less critical.

In other embodiments, the PLL oscillator 468 may comprise a voltage controlled oscillator instead of a digitally controlled oscillator.

Although the wireless communication device 400 has been described with reference to LTE by way of example, the wireless communication device 400 can have application in other systems.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims.

The invention claimed is:

1. A wireless communication device configured to transmit a transmission signal in an assigned channel bandwidth, the wireless communication device comprising:
   a local oscillator configured to generate a local oscillator signal at a local oscillator frequency;
   a modulator configured to convert in-phase and quadrature-phase components of a modulation signal at a modulation frequency to a radio frequency by mixing the in-phase and quadrature-phase components with the local oscillator signal;
   wherein the local oscillator frequency is arranged to place a third order intermodulation product, having a frequency equal to the local oscillator frequency minus three times the modulation frequency, within the assigned channel bandwidth;
   a controller configured to place the third order intermodulation product within the assigned channel bandwidth by:
      changing the local oscillator frequency by a local oscillator offset frequency; and
      changing the modulation frequency by a modulation frequency offset equal and of opposite sign to the local oscillator offset frequency; and
   a sample rate converter configured to change the modulation frequency by the modulation offset frequency by converting a sample rate of the in-phase and quadrature-phase components of the modulation signal.

2. The wireless communication device of claim 1:
   wherein the wireless communication device is configured to vary, within the assigned channel bandwidth, a transmission bandwidth of the transmission signal;
   wherein the controller is configured to change the local oscillator frequency to place the third order intermodulation product within the assigned channel bandwidth in response to a variation of the transmission bandwidth.

3. The wireless communication device of claim 2, wherein the wireless communication device is configured to vary the transmission bandwidth in response to receiving an instruction.

4. The wireless communication device of claim 1, wherein the controller is configured to change the local oscillator frequency to place the third order intermodulation product within the assigned channel bandwidth in response to a variation of a maximum permitted power emission level outside of the assigned channel bandwidth.

5. The wireless communication device of claim 1, wherein the controller is configured to change the local oscillator frequency to place the third order intermodulation product within the assigned channel bandwidth in response to a variation of a transmit power level of the wireless communication device.

6. The wireless communication device of claim 1:
   wherein the controller comprises a table of values indicative of the local oscillator frequency suitable for placing the third order intermodulation product within the assigned channel bandwidth;
   wherein the values of the local oscillator frequency are dependent on at least one of:
      a transmission bandwidth of the transmission signal;
      a transmission frequency of the transmission signal;
      a transmit power level of the wireless communication device;

a maximum permitted power emission level outside of the assigned channel bandwidth.

7. The wireless communication device of claim 1:
wherein the transmission signal is an orthogonal frequency division multiplex signal comprising a plurality of sub-carriers;
the wireless communication device is configured to vary the transmission bandwidth by varying a number of sub-carriers in the plurality of sub-carriers.

8. The wireless communication device of claim 7, wherein the wireless communication device is configured to vary the number of sub-carriers in the plurality of sub-carriers at intervals of substantially one millisecond.

9. The wireless communication device of claim 1, wherein the local oscillator comprises a phase locked loop configured for two point modulation.

10. A wireless communication device configured to transmit a transmission signal in an assigned channel bandwidth, the wireless communication device comprising:
a local oscillator configured to generate a local oscillator signal at a local oscillator frequency;
a modulator configured to convert in-phase and quadrature-phase components of a modulation signal at a modulation frequency to a radio frequency by mixing the in-phase and quadrature-phase components with the local oscillator signal;
wherein the local oscillator frequency is arranged to place a third order intermodulation product, having a frequency equal to the local oscillator frequency minus three times the modulation frequency, within the assigned channel bandwidth;
wherein the local oscillator comprises a phase locked loop configured for two point modulation;
wherein the phase locked loop comprises a phase locked loop oscillator comprising:
a first switchable capacitance ladder for relatively coarse tuning of the phase locked loop oscillator; and
a second switchable capacitance ladder for relatively fine tuning of the phase locked loop oscillator.

11. A method of controlling a wireless communication device configured to transmit a transmission signal in an assigned channel bandwidth, the method comprising:
generating a local oscillator signal at a local oscillator frequency;
converting in-phase and quadrature-phase components of a modulation signal at a modulation frequency to a radio frequency by mixing the in-phase and quadrature-phase components with the local oscillator signal;
wherein the local oscillator frequency is set to place a third order intermodulation product, having a frequency equal to the local oscillator frequency minus three times the modulation frequency, within the assigned channel bandwidth;
placing the third order modulation product within the assigned channel bandwidth by:
changing the local oscillator frequency by a local oscillator offset frequency; and
changing the modulation frequency by a modulation frequency offset equal and of opposite sign to the local oscillator offset frequency; and
changing the modulation frequency by the modulation offset frequency by converting a sample rate of the in-phase and quadrature-phase components of the modulation signal.

12. The wireless communication device of claim 10, wherein the phase locked loop oscillator further comprises a third capacitive ladder for modulating a frequency of the phase locked loop oscillator.

13. A method of controlling a wireless communication device configured to transmit a transmission signal in an assigned channel bandwidth, the method comprising:
generating a local oscillator signal at a local oscillator frequency;
converting in-phase and quadrature-phase components of a modulation signal at a modulation frequency to a radio frequency by mixing the in-phase and quadrature-phase components with the local oscillator signal;
wherein the local oscillator frequency is set to place a third order intermodulation product, having a frequency equal to the local oscillator frequency minus three times the modulation frequency, within the assigned channel bandwidth;
wherein the local oscillator comprises a phase locked loop configured for two point modulation by:
relatively coarse tuning the phase locked loop oscillator using a first switchable capacitance ladder; and
relatively fine tuning the phase locked loop oscillator using a second switchable capacitance ladder.

* * * * *